United States Patent [19]
Clukey

[11] Patent Number: 5,644,460
[45] Date of Patent: Jul. 1, 1997

[54] MULTI-RAIL ELECTROSTATIC DISCHARGE PROTECTION DEVICE

[75] Inventor: Stephen W. Clukey, South Portland, Me.

[73] Assignee: National Semiconductor Corporation, Santa Clara, Calif.

[21] Appl. No.: 647,274

[22] Filed: May 13, 1996

Related U.S. Application Data

[63] Continuation of Ser. No. 184,261, Jan. 21, 1994, abandoned.
[51] Int. Cl.$^6$ ............................................. H02H 9/00
[52] U.S. Cl. ........................... 361/56; 361/91; 361/111
[58] Field of Search .................... 361/18, 54, 56, 361/58, 91, 111, 118, 119, 126, 127

[56] References Cited

U.S. PATENT DOCUMENTS

| | | | |
|---|---|---|---|
| 5,157,571 | 10/1992 | Gotz | 361/54 |
| 5,301,084 | 4/1994 | Miller | 361/915 |

Primary Examiner—Jeffrey A. Gaffin
Assistant Examiner—Ronald W. Leja
Attorney, Agent, or Firm—Chris A. Caseiro; Thomas L. Bohan

[57] ABSTRACT

Device for protecting against circuit-damaging voltage spikes at input nodes and output nodes of electrical circuits and between high- and low-potential power rails. The voltage spikes are of the type identified generally as electrostatic discharges. The device includes a plurality of semiconductor elements, which are preferably bipolar transistors, coupled to the power rails and an input node or an output node of the circuit such that all types of electrostatic discharges can be diverted using the single device of the present invention. In the preferred embodiment of the invention the transistors have a common collector, their bases are open, and they are configured so that the emitter of one transistor is coupled to the high-potential power rail, the emitter of a second transistor is coupled to the low-potential power rail, and the emitter of a third transistor is coupled to the node to be protected. Various combinations of the breakdown characteristics of the several coupled transistors operate to divert all types of voltage spikes, including positive and negative spikes at the node, and positive and negative spikes between the power rails. The device of the present invention is smaller and faster than prior electrostatic discharge protection devices, with sufficient capacity to handle expected transient voltage levels.

24 Claims, 3 Drawing Sheets

MULTI-RAIL ELECTROSTATIC DISCHARGE PROTECTION DEVICE

This is a continuation of application Ser. No. 184,261, filed Jan. 21, 1994, now abandoned.

BACKGROUND OF THE INVENTION

1. Field of the Invention

The present invention relates to apparatus for protecting integrated circuits (ICs) against electrostatic discharge (ESD) damage. In particular, this invention relates to a simple multiple-component guarding device capable of diverting dangerous charge accumulations away from input nodes, output nodes, and power rails of ICs. More particularly, this invention relates to a simple multiple-bipolar transistor guarding device used to divert such charge accumulations. Most specifically, this invention relates to a single bipolar device which when coupled to the input pin and to the output pin provides ESD protection to those pins and to the high-potential and low-potential power rails of an IC.

2. Description of the Prior Art

The risks to ICs posed by accumulations of electrostatic charge are well known. Although they generally constitute but a small quantity of charge, such accumulations can result in quite high voltages and thus high risk to circuit elements through which they may be discharged.

ESD protection strategies have generally involved providing a voltage-sensitive switch through which the accumulated charge can be diverted and then drained harmlessly. Such a switch must be implemented so that legitimate data signals are not also diverted. Typical data signals range from a logic-high of five volts to a logic-low of 0 volts. The transient voltage spikes against which protection is sought are of varying magnitudes. Any ESD protection device must ensure that all voltages exceeding the circuit's damage-threshold level—which may be just a few volts above the logic-high level—are diverted, while voltages at the logic-high level and below are left unaffected. The other requirement, of course, is that the ESD protection work extremely fast; it will do no good to divert a 20-volt pulse after that pulse has permanently damaged the circuit. It will also hamper normal circuit performance if the protection device requires so long to discharge the spike that the circuit input is "pegged" at a fixed voltage for a prolonged time, even if that voltage does not cause permanent damage.

There are two generally-accepted models for analyzing the protection effectiveness of fabricated electrostatic protection devices. One, the Human Body Model (HBM), is designed to determine the ability of an ESD protection device to divert a charge delivered by an external source away from a circuit's input or output pin before that charge damages the circuit. The other, the Charge Device Model (CDM), is designed to determine the ability of an ESD protection device to divert a charge stored by a circuit before that charge is discharged from the circuit's input or output pin to external devices. The HBM has been the most widely-utilized analysis and accounts for the most common type of electrostatic discharge observed. However, discharges tracking the CDM also occur and may be unguarded against because of the emphasis on the HBM. The discharges observed under the HBM vary widely, and a "mid-range" ESD protection device will divert HBM discharges in the range of 2000 V–4000 V that normally last for tens of nanoseconds. CDM discharges are generally of lower potential, with the same type of ESD protection device expected to divert discharges in the range of about 1000 V–1500 V. The differences are in 1) the duration of the discharge, with the CDM type lasting for only tenths of nanoseconds, and 2) the current applied, with the CDM discharge providing more current than an HBM discharge. Both differences are due to the difference in the RC time constant associated with each type of discharge. The CDM is related to charge-storing entities with lower capacitances than those identified by the HBM. Additionally, the CDM involves much lower resistances than observed for HBM elements. It has recently been observed that the CDM discharges are in fact more damaging to ICs—and gate oxides of transistors in particular—and thus more likely to cause IC failure. This is often the case when circuit boards are coupled together, as in the case of computer fabrication, for example. Therefore, in order to provide both HBM and CDM protection, an ESD protection device must be able to divert significant voltage spikes and relatively high currents quickly in order to protect internal circuitry and circuitry coupled to that internal circuitry.

FIG. 1 shows a typical prior-art ESD protection device. It protects the input pin against positive voltage spikes exceeding the voltage of the high-potential power rail by a certain threshold amount. The protection mechanism involves punch-through conduction through the bipolar transistor. Thus, the threshold protection voltage for the system of FIG. 1 is $V_{df}$+VCEO, where $V_{df}$ is the drop across the forward-biased diode and VCEO is the collector-emitter voltage at which the bipolar transistor undergoes punch-through. Voltages in excess of $V_{cc}$+($V_{df}$+VCEO) appearing on the input pin are diverted to the high-potential power rail. [Generally, when a circuit is powered down, the high-potential power rail is grounded; consequently during power-down, the input pin is protected against positive voltage spikes in excess of ($V_{df}$+VCEO).] The role of the diode is obviously that of a blocker. The bipolar transistor must be designed so as to have a punch-through voltage that will ensure protection against spikes exceeding the circuit's damage threshold while at the same time not allowing logic-high data signals to be diverted.

Obviously, the circuit of FIG. 1 does not provide protection against negative voltage spikes applied to the input pin. Nevertheless, a solution is available, as shown in FIG. 2, wherein a second diode—typically a Schottky-clamped diode—forward-biased from ground to the input pin protects against negative voltage spikes, possibly in addition to other functions it serves in the circuit. Of course, similar protection must be provided for output pins and where CDM discharges are of concern. Such protection must also be provided to protect against spikes occurring between the high- and low-potential power rails. It can be seen, then, that the prior devices were directed to specific transients such that a multiple of devices was needed to protect a single pin and/or a single power rail. As a result, the space on a chip that must be reserved for ESD protection is considerable and the delay associated with the multiple components is increased. This is an undesirable occurrence when the goal is smaller and faster integrated circuitry.

The various prior-art approaches to the problem share a couple of significant drawbacks. One is that different circuits are required to protect the I/O pins against the two different polarities with which electrostatic accumulations may appear. As previously noted, another drawback is in the space that such prior devices take up on a chip. One continuing goal in IC fabrication is a reduction in size and an increase in speed. The prior devices such as those illustrated in FIGS. 1 and 2 take up a significant amount of space, particularly since multiple components are required for the various ESD situations. In addition, the number of ESD protection devices required at the size needed to divert typical HBM and CDM discharges slows the operation of the entire circuit. Still another drawback of the prior devices described is their relative unreliability in performing the desired function. In some instances discharge diversion is achieved while in similar but not exactly identical conditions circuit overload occurred. It is believed that the protection, when it occurred, was a function of the fabrication of the device, and variations in parasitic capacitance caused thereby, which incidentally provided protection, rather than the design and coupling of the device. Therefore, what is needed is a simple circuit which meets all ESD protection needs with the same form, a circuit which will protect input and output pins and each of the power rails, regardless of the polarity of the voltage to be diverted. What is further needed is such a circuit which does not rely upon the particular structure of the circuit being protected. What is also needed is an ESD protection device which takes up less space on a chip than prior devices did when used in the same application of complete ESD protection. A related goal is to provide for faster diversion of electrostatic discharges, corresponding with the faster speed of current devices.

SUMMARY OF THE INVENTION

The ESD protection device of the present invention provides for fast diversion of voltage spikes of all types at input/output pins as well as from one potential rail to another. This is achieved in a single device that can be a unitary component formed of several subsections. A key feature of the present invention is to provide pathways with voltage-breakdown levels that exceed the typical logic operating levels of the circuit to be protected yet that are also low enough that the voltage spikes to be diverted are in fact diverted prior to damage occurring to one or more of the circuit's components. This is accomplished in the present invention by linking semiconductor elements together such that the characteristics of the elements provide summed voltage breakdown levels as required. The semiconductor components may be diodes or bipolar transistors, for example. In the preferred embodiment of the present invention, as shown schematically in FIG. 3, the new ESD structure includes three bipolar transistors with their collectors tied together and the bases of all three transistors open. One emitter is tied to the pin to be guarded (either input or output), one to the high-potential power rail, and one to the low-potential power rail. Since the three-transistor device is symmetric it matters not which emitter is connected to which node. As is known in this field, leaving the bases of the transistors open, or "floating" fixes the collector-emitter and emitter-collector breakdown voltages more certainly. However, it is to be understood that one or more of the bases may be tied off by coupling them to their emitter node for example. In that situation the total breakdown of the diversion path would be related to the breakdown characteristic of one of the transistors, with the other transistor on. This may be particularly advantageous when the circuit to be protected operates at a relatively low voltage, such as 3 V or even 2 V. In any case, the voltage breakdown of the collector-emitter or emitter-collector transistor will not be a straightforward calculation. Instead, the breakdown will be somewhat variable, and could well be higher than if the base is left floating—a situation that may be desirable in some cases.

Designating the high-potential power rail as $V_{cc}$ and the low-potential power rail as GND, the breakdown characteristics of the three-transistor structure is as follows:

Input-to-ground (positive voltage): VECO+VCEO
Input-to ground (negative voltage): VCEO+VECO
Input to $V_{cc}$ (positive voltage): VECO+VCEO
Input to $V_{cc}$ (negative voltage): VCEO+VECO
$V_{cc}$ to GND (positive voltage): VECO+VCEO
$V_{cc}$ to GND (negative voltage): VCEO+VECO, where VCEO is the voltage breakdown from the collector to the emitter, with the base open, and VECO is the voltage breakdown from the emitter to the collector, again with the base open.

Thus it can be seen that in addition to the simplicity which symmetry lends to the protective circuit, this symmetry also shows up in the uniformity of breakdown threshold, the maximum voltage which the protective circuit will allow to be imposed on any of the pins coming under its protection.

The new ESD structure protects input and output pins from ESD damage due to positive and negative voltages relative to $V_{cc}$ or GND. Furthermore, it does not rely for its efficacy upon any feature of the circuit being protected. This feature will provide more predictable ESD results. A single structure on each pin can provide the protection needed for all anticipated forms of ESD. It is to be noted that any semiconductor device with suitable breakdown characteristics, such as a diode structure, may be substituted on a one-for-one basis for any of the transistor structures illustrated provided the breakdown features described are met.

DETAILED DESCRIPTION OF THE PREFERRED EMBODIMENT

Figure 3:
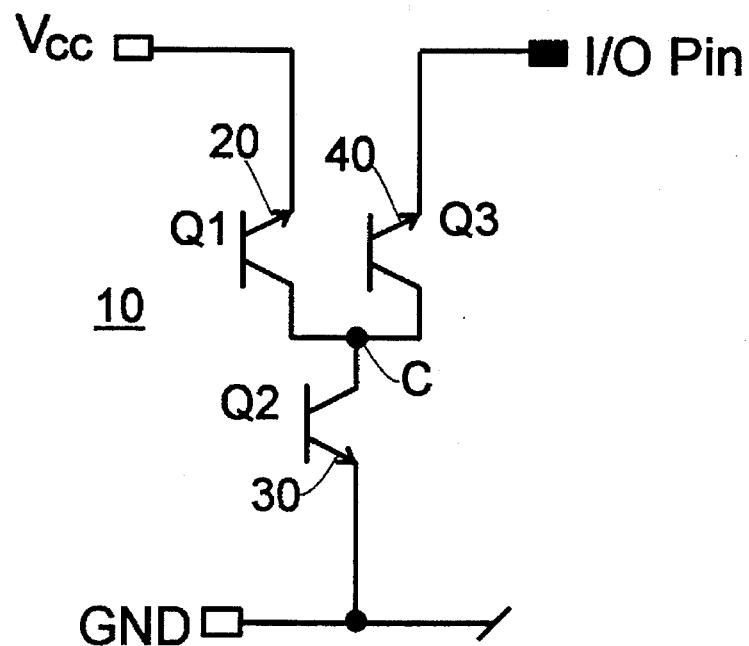
FIG. 3 is an electrostatic discharge protection device of the present invention.

As illustrated in FIG. 3, an electrostatic discharge (ESD) protection device 10 of the present invention includes a first bipolar transistor Q1, a second bipolar transistor Q2, and a third bipolar transistor Q3, all with a common collector C. The ESD protection device 10 provides protection against both positive and negative voltage spikes occurring at either an input pin or an output pin (I/O Pin) of an integrated circuit. It also protects against such voltage spikes between the high-potential power rail $V_{cc}$ and the low-potential power rail GND. Although the device illustrated includes three bipolar transistors, it is to be understood that any semiconductor components with suitable breakdown characteristics may be substituted therefor.

In the preferred embodiment of the present invention as illustrated in FIG. 3, a first emitter 20 of the first bipolar transistor Q1 is coupled to high-potential power rail $V_{cc}$, a second emitter 30 of the second bipolar transistor Q2 is coupled to low-potential power rail GND, and a third emitter 40 of the third bipolar transistor Q3 is coupled to the I/O Pin. It is to be understood, however, that when all three transistors are fabricated in the same way with the common collector C, the three emitter connections are interchangeable so that first emitter 20 may be coupled to pin I/O Pin, second emitter 30 may be coupled to $V_{cc}$, etc, as a function of the particular layout of the circuit to be protected. It is also to be noted that the ESD protection device 10 of the present invention may be fabricated such that each of the bipolar transistors has a separate collector region rather than common collector C. However, such a fabrication would increase the size of the ESD protection device 10 slightly.

In the illustrated version of the invention it can be seen that first, second, and third bases 21, 31, and 41 of the three transistors are open; that is, they are not connected to "external" components. Alternatively, these base regions of the transistors may be resistively tied to external components or they may be "shorted" by connecting them to their respective nodes, with the consequences and modifications in breakdown characteristics as previously noted.

Figure 4:
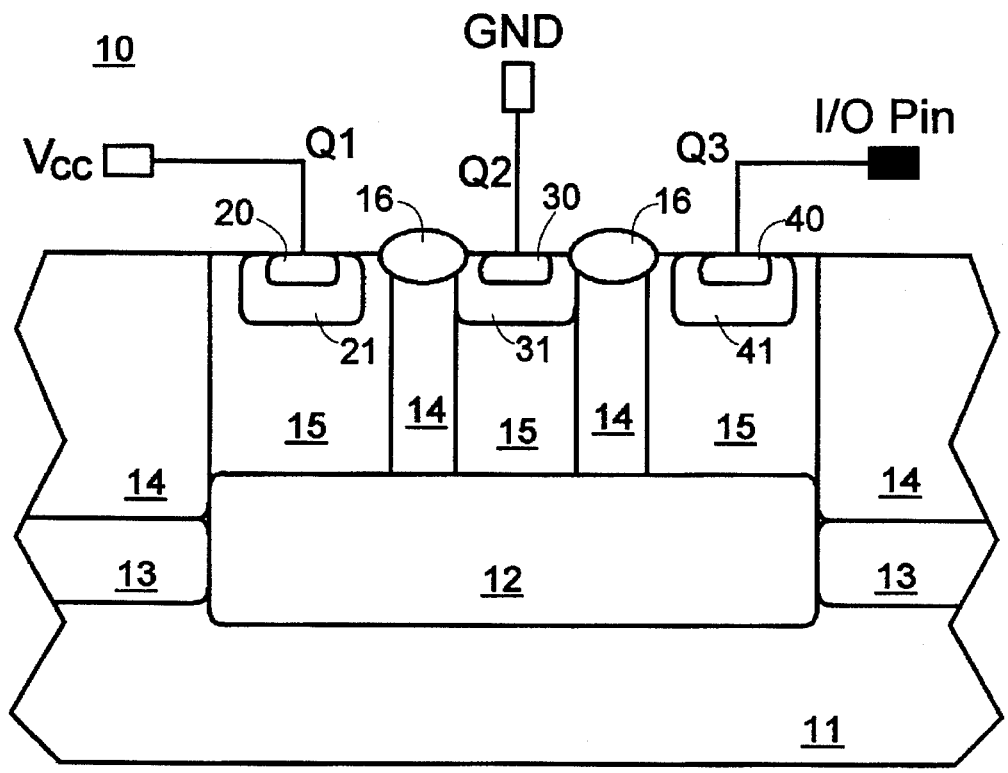
FIG. 4 is a simplified diagrammatic cross-section of the physical structure of the discharge protection device of the present invention as it appears in the chip in which the circuit to be protected is fabricated.

In the simplified cross-sectional structural view of the preferred embodiment of the present invention illustrated in FIG. 4, the ESD protection device 10 includes a substrate 11 of semiconductor material of first conductivity type underlying a buried common buried collector layer 12 of semiconductor material of second conductivity type. Channel stop regions 13 and isolation oxide regions 14 physically separate and electrically isolate circuit components from one another. In addition, isolation oxide regions 14 isolate individual bases of each of the three bipolar transistors from each other. An epitaxial layer 15 of semiconductor material of second conductivity type formed on the buried collector layer 12, along with the buried collector layer 12, forms part of the common collector C of the present invention. First base region 21, second base region 31, and third base region 41 of semiconductor material of first conductivity type are formed in portions of the surface of the epitaxial layer 15 and then emitter regions 20, 30, and 40 of semiconductor material of second conductivity type are formed in portions of the surfaces of the noted base regions, respectively. Field oxide regions 16, in addition to the isolation oxide regions 14, provide further physical separation and electrical isolation of the active regions of the three bipolar transistors.

In the preferred embodiment of the present invention, the semiconductor material of first conductivity type is P type material and the semiconductor material of second conductivity type is N type material. It is to be understood, however, that the material types may be reversed without changing the ultimate function of the ESD protection device 10. When the ESD protection device 10 is fabricated as indicated, with the characteristic dimension of the emitter regions 20, 30, and 40 each at 100 microns nominal, the diversion of voltage spikes by the ESD protection device 10 occurs when such voltage spikes exceed the breakdown voltages of the transistors Q1, Q2, and Q3 in the following combinations:

Pin-to-GND (positive voltage spike): $V_{ECOQ3} + V_{CEOQ2}$
Pin-to-GND (negative voltage spike): $V_{CEOQ3} + V_{ECOQ2}$
Pin-to-$V_{cc}$ (positive voltage spike): $V_{ECOQ3} + V_{CEOQ1}$
Pin-to-$V_{cc}$ (negative voltage spike): $V_{CEOQ3} + V_{ECOQ1}$
$V_{cc}$-to-GND (positive voltage spike): $V_{ECOQ1} + V_{CEOQ2}$
$V_{cc}$-to-GND (negative voltage spike): $V_{CEOQ1} + V_{ECOQ2}$ wherein:

$V_{CEOQ1}$ is the collector-to-emitter breakdown voltage of transistor Q1, $V_{ECOQ1}$ is the emitter-to-collector breakdown voltage of transistor Q1, $V_{CEOQ2}$ is the collector-to-emitter breakdown voltage of transistor Q2, $V_{ECOQ2}$ is the emitter-to-collector breakdown voltage of transistor Q2, $V_{CEOQ3}$ is the collector-to-emitter breakdown voltage of transistor Q3, and $V_{ECOQ3}$ is the emitter-to-collector breakdown voltage of transistor Q3.

For a typical buffer operating with a high-potential power rail at 5 V, for example, and with the transistors Q1, Q2, and Q3 having the noted emitter dimensions, $V_{CE}$ will be approximately 7.5 V and $V_{EC}$ will be approximately 2.5 V. This total 10 V breakdown is sufficiently above the maximum operating logic-high value of 7 V expected for 5 V systems so that legitimate logic signals will not be diverted, and at the same time sufficiently below typical gate breakdown voltages of 15 V that protected devices will not be damaged by positive or negative voltage spikes. This breakdown level also provides enough leeway to accommodate anticipated fabrication variations that may slightly lower or raise the noted breakdown characteristics without compromising the protection capabilities noted. Of course, the "O" designation indicates that the bases of the three transistors are left open, for the reason previously stated. However, it is to be understood that particular collector-emitter and emitter-collector breakdowns would still be utilized to achieve ESD protection in the event that one or more of the bases of the transistors was tied off in some way and not left floating.

Figure 5:
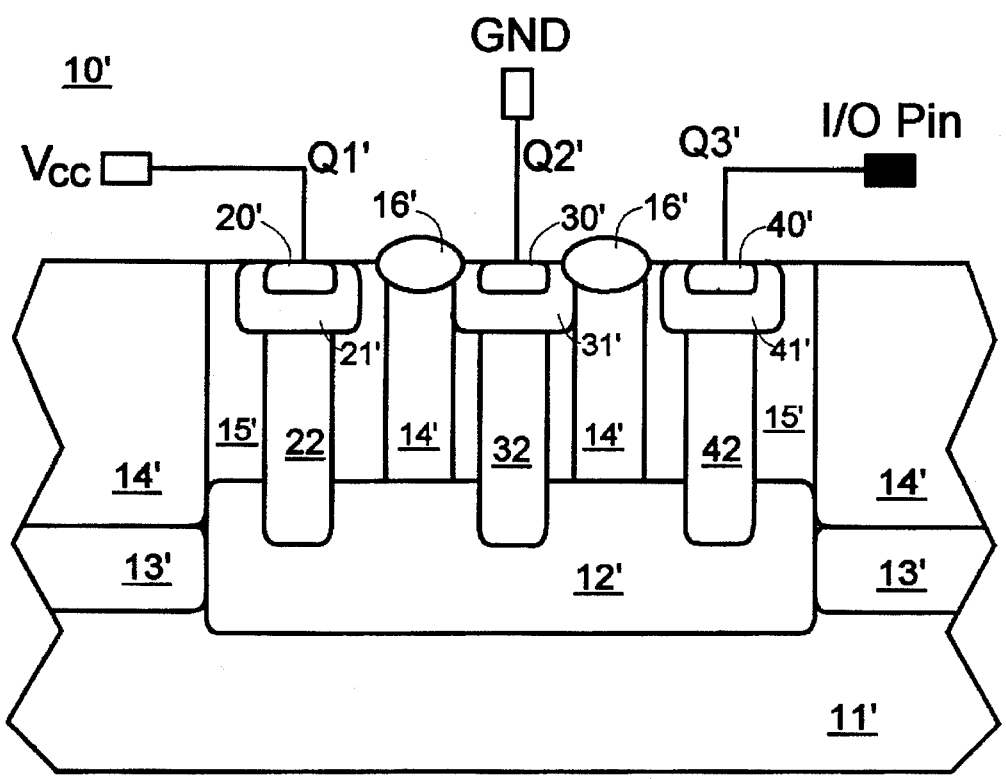
FIG. 5 is a simplified diagrammatic cross-section of the physical structure of an alternative version of the discharge protection device of the present invention, showing optional sub-emitter collector regions.

Although the ESD protection device 10 of the present invention has been described with specific reference to the structural design illustrated in FIG. 4, and with specific reference to protection of typical 5 V buffers, it is to be understood that the design illustrated in FIG. 3, can be utilized to protect I/O Pins and power rails of circuitry operating at lower high-potential power levels, including those systems identified generally as 3 V and 2 V systems. In such situations, the characteristic breakdown values of transistors Q1, Q2, and Q3 can be reduced, such as by reducing their characteristic dimensions, by increasing doping levels, and/or by modifying the structural design of the ESD protection device 10. One example of design modification providing lower breakdown characteristics is illustrated in FIG. 5. In that simplified cross-sectional structural view, components equivalent to those shown in FIG. 4 are given the same numerical designations with the addition of a "'" to denote the variation. For the alternative embodiment of the present invention shown in FIG. 5, the ESD protection device 10' remains essentially the same as ESD protection device 10 except that additional conductive sections are included as part of the common collector C' so as to reduce the breakdown characteristics of each of the bipolar transistors Q1', Q2', and Q3'. Specifically, the additional conductive sections are sub-emitter collector regions 22, 32, and 42 formed in the epitaxial layer 15' underlying the respective base regions 21', 31', and 41', and aligned with the respective emitter regions 20', 30', and 40'. The sub-emitter collector regions are formed of semiconductor material of second conductivity type and include greater concentrations of dopants than are found in the epitaxial layer 15'. The sub-emitter collector regions are also linked to the buried collector layer 12'. The enhanced doping of each of the bipolar transistors lowers their breakdown voltages $V_{CE}$ and $V_{EC}$ and reduces their capacitances, thus increasing the diverting speed of the ESD protection device 10' over that of the ESD protection device 10, to the extent that such an increase in diversion speed is required for buffers, or any type of IC systems operating at lower potentials.

The ESD protection device 10 of the present invention is an improvement over prior similar devices in that this single component provides for diversion of all types of voltage spikes from I/O pins as well as from the power rails. The prior devices, on the other hand, included a combination of components, each directed to protecting against a specific type of voltage spike at a particular location. As a result of the improved design of the present invention, the amount of space on a chip dedicated to ESD protection is reduced significantly. More over, the ESD protection device 10 of the present invention, as a single component, is independent of the circuitry it is protecting in that it does not rely upon vagaries of the circuit to be protected to provide supplemental protection against one or more of the several types of ESD of concern. It therefore provides much greater reliability in protecting against all types of electrostatic discharges to be experienced, whether at I/O pins, as defined by both the Human Body and Charged Device Models, or at either power rail.

The ESD protection device 10 is preferably located in close proximity to the I/O Pin, as is common with most ESD protection devices, so as to minimize the delay in charge diversion. In particular, the ESD protection device 10 may be fabricated such that the metal of the I/O Pin may be the same metal used to form the contact coupling the third emitter region 40 of the third bipolar transistor Q3 to the I/O Pin. As a result, a total of only three connections are required for complete ESD protection. Prior devices having multiple components require additional connections, thereby increasing the used chip space as well as inviting increased failure rate.

Figure 1:
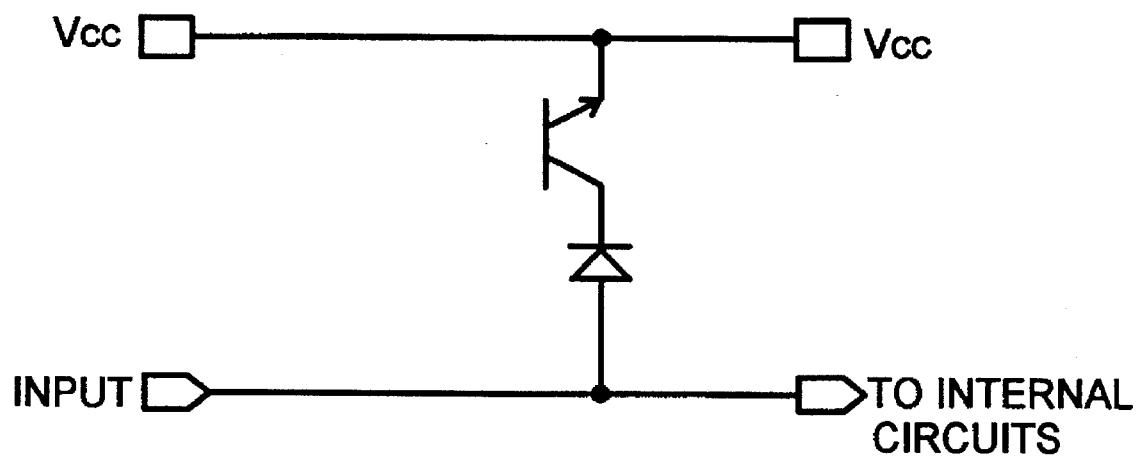
FIG. 1 is a prior art electrostatic discharge protection circuit that uses a blocking diode in series with a bipolar transistor to protect a pin against voltage spikes positive with respect to the high-potential power rail powering a circuit.
Figure 2:
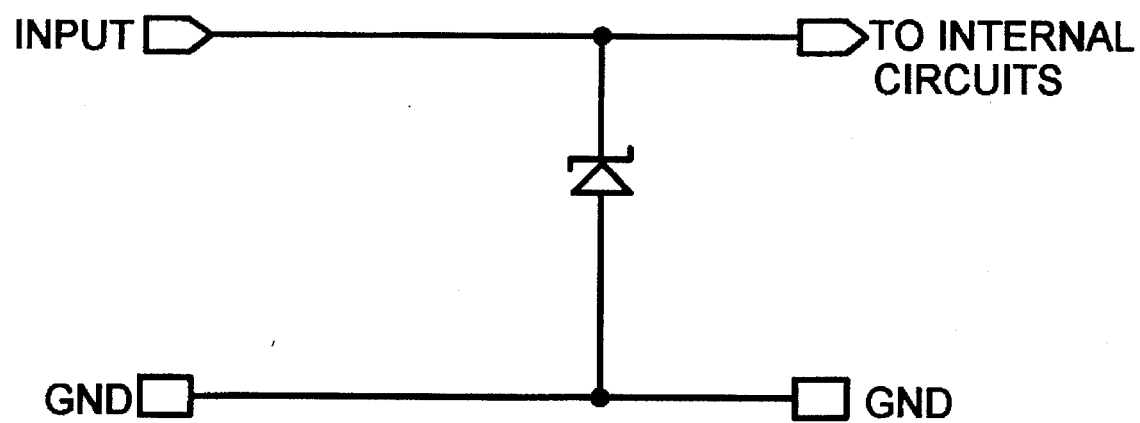
FIG. 2 is a prior art electrostatic discharge protection circuit that uses a blocking diode to protect a pin against voltage spikes negative with respect to the low-potential power rail powering a circuit.
Figure 6:
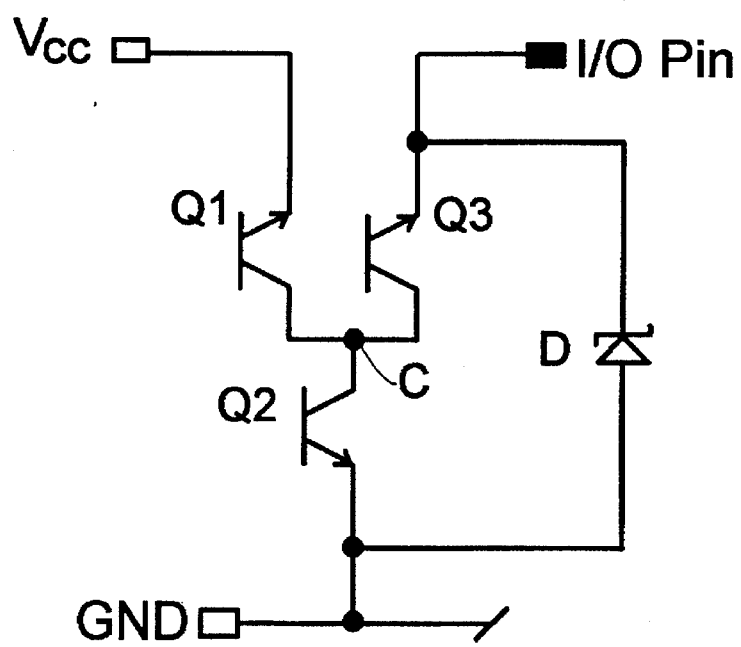
FIG. 6 is an alternative embodiment of the electrostatic protection circuit of the present invention, showing the optional clamping diode coupled to a bipolar transistor of the device.

An optional component that may enhance the operation of the ESD protection device 10 is a clamping diode D, coupled as illustrated in the alternative embodiment illustrated in FIG. 6. The clamping diode D, which is preferably a Schottky diode much in the same design as the diode illustrated in FIGS. 1 and 2, is forward-biased from GND to the pin I/O Pin. While the diode D may be principally designed to clamp the I/O Pin against "undershoots," it also provides ESD protection in the limited specific case where negative output swings fall below the potential of GND in that it can quickly source a relatively large amount of current in that specific case.

Although the preferred embodiment of the present invention, with several alternatives, has been described herein, the above description is merely illustrative. Further modification of the invention disclosed will occur to those skilled in the art, and all such modifications and equivalents are deemed to be within the scope of the invention as defined by the appended claims.

I claim:

1. Apparatus for protecting an electrical circuit against circuit-damaging voltage spikes, wherein said electrical circuit is coupled to a high-potential power rail and to a low-potential power rail, said apparatus comprising a plurality of semiconductor elements wherein a first bipolar transistor is coupled to said high-potential power rail, a second bipolar transistor is coupled to said low-potential power rail and to said first bipolar transistor, and a third bipolar transistor having an output coupled to an input node or an output node of said electrical circuit and not directly coupled to said high-potential power rail, said third bipolar transistor also being coupled to said first bipolar transistor and to said second bipolar transistor, wherein said first bipolar transistor, said second bipolar transistor, and said third bipolar transistor have a common collector.

2. The apparatus as claimed in claim 1 wherein said bipolar transistors are NPN-type bipolar transistors.

3. The apparatus as claimed in claim 1 wherein an emitter of said first bipolar transistor is coupled to said high-potential power rail, an emitter of said second bipolar transistor is coupled to said low-potential power rail, and an emitter of said third bipolar transistor is coupled to said input node or said output node of said electrical circuit.

4. The apparatus as claimed in claim 3 wherein a base of said first bipolar transistor, a base of said second bipolar transistor, and a base of said third bipolar transistor are all open.

5. The apparatus as claimed in claim 4 wherein said high-potential power rail is at a nominal potential of about 5 V and wherein the collector-emitter breakdown voltage of each of said transistors is about 7.5 V and the emitter-collector breakdown voltage of each of said transistors is about 2.5 V.

6. The apparatus as claimed in claim 1 further comprising a diode coupled between said low-potential power rail and said input node or said output node of said electrical circuit.

7. The apparatus as claimed in claim 6 wherein said diode is a Schottky diode.

8. The apparatus as claimed in claim 7 wherein said Schottky diode is forward biased from said low-potential power rail to said input node or said output node.

9. An apparatus for diverting electrostatic discharges from an input node or an output node of an electrical circuit and for diverting electrostatic discharges between a high-potential power rail and a low-potential power rail, wherein said high-potential power rail and said low-potential power rail are coupled to said electrical circuit, said apparatus comprising:

a) a first bipolar transistor having an emitter coupled to said high-potential power rail, with said first bipolar transistor having a first collector;

b) a second bipolar transistor having an emitter coupled to said low-potential power rail, with said second bipolar transistor having a second collector;

c) a third bipolar transistor having an emitter coupled to an input node or an output node of said electrical circuit, with said third bipolar transistor having a third collector, wherein said first collector, said second collector, and said third collector are directly coupled together; and d) a clamping Schottky diode coupled between said low-potential power rail and said input node or said output node to which said third bipolar transistor is coupled, wherein said Schottky diode is forward biased from said low-potential power rail to said input or said output node.

10. The apparatus as claimed in claim 9 wherein said bipolar transistors are NPN-type bipolar transistors.

11. The apparatus as claimed in claim 10 wherein bases of said bipolar transistors are open.

12. A buffer having an apparatus for protecting against circuit-damaging voltage spikes, wherein said buffer is coupled to a high-potential power rail and to a low-potential power rail, said apparatus comprising a plurality of transistors, wherein a first transistor is coupled to said high-potential power rail, a second transistor is coupled to said low-potential power rail and to said first transistor, and a third transistor having an output coupled to an input node or an output node of said buffer and not directly coupled to said high-potential power rail, said third transistor also being coupled to said first transistor and to said second transistor, wherein said first transistor, said second transistor, and said third transistor are each bipolar and have a common collector.

13. The buffer as claimed in claim 12 wherein an emitter of said first transistor is coupled to said high-potential power rail, an emitter of said second transistor is coupled to said low-potential power rail, and an emitter of said third transistor is coupled to said input node or said output node.

14. The buffer as claimed in claim 13 wherein a base of said first transistor, a base of said second transistor, and a base of said third transistor are all open.

15. The buffer as claimed in claim 12 further comprising a Schottky diode coupled between said low-potential power rail and said input node or said output node of said buffer.

16. A method for protecting an electrical circuit against circuit-damaging voltage spikes, wherein said electrical circuit is coupled to a high-potential power rail and to a low-potential power rail, the method comprising the steps of:

a) coupling an emitter of a first bipolar transistor to said high-potential power rail;

b) coupling an emitter of a second bipolar transistor to said low-potential power rail, and coupling said second bipolar transistor to said first bipolar transistor; and c) coupling an emitter of a third bipolar transistor to an input or an output of said electrical circuit and not directly to said high-potential power rail, and coupling said third bipolar transistor to said first bipolar transistor and to said second bipolar transistor.

17. The method as claimed in claim 16 wherein the steps of coupling said first bipolar transistor, said second bipolar transistor and said third bipolar transistor together includes the step of providing a common collector shared by each of said transistors.

18. The method as claimed in claim 17 further comprising the step of leaving bases of each of said bipolar transistors open.

19. The method as claimed in claim 16 further comprising the step of coupling a diode between said low-potential rail and said input or said output to which said second bipolar transistor is coupled.

20. The method as claimed in claim 19 wherein said diode is a Schottky diode forward biased from said low-potential power rail to said input or said output.

21. Apparatus for protecting an electrical circuit against circuit-damaging voltage spikes, wherein said electrical circuit is coupled to a high-potential power rail and to a low-potential power rail, said apparatus comprising a plurality of semiconductor elements wherein a first semiconductor element is coupled to said high-potential power rail, a second semiconductor element is coupled to said low-potential power rail and to said first semiconductor element, and a third semiconductor element having an output coupled to an input or an output of said electrical circuit and not directly coupled to said high-potential power rail, said third semiconductor element also being coupled to said first semiconductor element and to said second semiconductor element where said third semiconductor element is configured to have no more than three pathways to said low-potential power rail.

22. The apparatus as claimed in claim 21 further comprising a diode coupled between said low-potential power rail and said input or said output of said electrical circuit.

23. A buffer having an apparatus for protecting against circuit-damaging voltage spikes, wherein said buffer is coupled to a high-potential power rail and to a low-potential power rail, said apparatus comprising a plurality of transistors, wherein a first transistor is coupled to said high-potential power rail, a second transistor is coupled to said low-potential power rail and to said first transistor, and a third transistor having an output coupled to an input or an output of said buffer and not directly coupled to said high-potential power rail, said third transistor also being coupled to said first transistor and to said second transistor where said third transistor is configured to have no more than three pathways to said low-potential power rail.

24. The apparatus as claimed in claim 23 further comprising a diode coupled between said low-potential power rail and said input or said output of said buffer.

* * * * *